(12) United States Patent
Usui et al.

(10) Patent No.: US 7,097,920 B2
(45) Date of Patent: Aug. 29, 2006

(54) GROUP III NITRIDE BASED SEMICONDUCTOR SUBSTRATE AND PROCESS FOR MANUFACTURE THEREOF

(75) Inventors: Akira Usui, Tokyo (JP); Masatomo Shibata, Tsuchiura (JP); Yuichi Oshima, Tsuchiura (JP)

(73) Assignees: NEC Corporation, (JP); Hitachi Cable, Ltd., (JP)

( * ) Notice: Subject to any disclaimer, the term of this patent is extended or adjusted under 35 U.S.C. 154(b) by 0 days.

(21) Appl. No.: 10/395,766

(22) Filed: Mar. 24, 2003

(65) Prior Publication Data

US 2003/0183157 A1    Oct. 2, 2003

(30) Foreign Application Priority Data

Mar. 26, 2002    (JP)    ............... 2002-084963

(51) Int. Cl.
  *B32B 19/00*    (2006.01)
  *C30B 15/14*    (2006.01)
(52) U.S. Cl. ............ 428/698; 428/336; 117/952; 117/953
(58) Field of Classification Search .......... 428/698, 428/336; 117/3, 952, 953
See application file for complete search history.

(56) References Cited

U.S. PATENT DOCUMENTS

| | | | | |
|---|---|---|---|---|
| 6,447,604 | B1 * | 9/2002 | Flynn et al. ............... | 117/89 |
| 6,468,882 | B1 * | 10/2002 | Motoki et al. ............ | 438/460 |
| 6,642,546 | B1 * | 11/2003 | Kuramoto et al. ......... | 257/94 |

FOREIGN PATENT DOCUMENTS

| | | | |
|---|---|---|---|
| CN | 1381870 A | * | 11/2002 |
| JP | 09-071496 | | 3/1997 |
| JP | 10-256662 | | 9/1998 |
| JP | 11-251253 | | 9/1999 |
| JP | 11-260737 | | 9/1999 |
| JP | 2000-012900 | | 1/2000 |
| JP | 2001-060719 | | 3/2001 |
| JP | 2001192300 | | 7/2001 |
| JP | 2002029897 A | * | 1/2002 |

OTHER PUBLICATIONS

A.Usui et al., Jpn. J. Appl. Phys., vol. 36 (1997) pp. L899-L902.
T.S. Zheleva, MRS Internet. J. Nitride Semicond. Res., 4S1, G3. 38 (1999).
S. Nakamura, et al., MRS Internet. J. Nitride Semicond. Res., 4S1, G1. 1 (1999).

(Continued)

*Primary Examiner*—Jennifer McNeil
*Assistant Examiner*—Timothy M. Speer
(74) *Attorney, Agent, or Firm*—Hayes Soloway P.C.

(57) ABSTRACT

To provide a semiconductor substrate of a group III nitride with a little warp, this invention provides a process comprising such steps of:

epitaxial-growing a GaN layer 33 with a GaN low temperature grown buffer layer 32 upon a sapphire substrate 31;

removing the sapphire substrate 31, the GaN buffer layer 32 and a small portion of the GaN layer 33 from the substrate taken out of a growth reactor to obtain a self-supporting GaN substrate 35; and after that, heat-treating the GaN substrate 35 by putting it into an electric furnace under the $NH_3$ atmosphere at 1200° C. for 24 hours; which leads to a marked reduction of the warp of the self-supporting GaN substrate 35 such that dislocation densities of its obverse and reverse surface are $4 \times 10^7$ $cm^{-2}$ and $8 \times 10^5$ $cm^{-2}$, and thereby such a low ratio of dislocation densities of 50 is well-controlled.

16 Claims, 7 Drawing Sheets

OTHER PUBLICATIONS

"Near Defect Free GaN Substrates" Porowski, Symposium G, 1998.

"Dislocation Reduced in GaN Grown by Hydride Vapor Phase Epitaxy via Growth Interruption Modulation" Zhang et al., Applied Physics Letters, vol. 78, No. 6, 2001.

"Characteristics of Free-Standing Hydride-Vapor-Phase-Epitaxy-Grown GaN with Very Low Defect Concentration" Visconti et al., Applied Physics letters vol. 77, No. 23, 2000, p. 3743-3745.

"Characterization of Free-Standing Hydride Vapor Phase Epitaxy GaN" Jasinaki et al., Applied Physics Letters vol. 78, No. 16, 2000, p. 2297-2299.

Electrochemical Society Proceedings Vo. 98-18, 1999, p. 79-86.

Scarching Results indicating the evidence to prove that the Electrochemical Proceedings were published in 1999.

* cited by examiner

GROUP III NITRIDE BASED SEMICONDUCTOR SUBSTRATE AND PROCESS FOR MANUFACTURE THEREOF

FIELD OF THE INVENTION

The present invention relates to a group III nitride based semiconductor substrate and a process for manufacture thereof.

BACKGROUND TO THE INVENTION

Since the nitride semiconductor material is known to have a sufficiently large band gap and besides its inter-band transition is of direct transition type, many investigations for utilizing the nitride semiconductor material in the short wavelength light emission device are underway. Furthermore, as its saturation drift velocity of electrons is high and the two-dimensional carrier gas is available in their heterojunction, the nitride semiconductor material is also regarded to be highly applicable to the electron device.

The nitride semiconductor layer to constitute these devices can be obtained by epitaxial growth on a base substrate with the vapor phase deposition method such as metal-organic vapor phase epitaxy (MOVPE) method, molecular beam epitaxy (MBE) method or hydride vapor phase epitaxy (HVPE) method. However, there is not any base substrate that has a lattice constant matching with that of this nitride semiconductor layer, and, therefore, a growth layer of good quality is hard to acquire and the nitride semiconductor layer obtained tends to contain numerous crystal defects. Because these crystal defects are a very factor to hinder the improvement of device performance, variety of approaches to decrease the crystal defects within the nitride semiconductor layer have been so far examined.

As one of the methods to obtain group III element nitride based crystals containing a relatively small number of crystal defects, there is known a method wherein a low temperature deposition buffer layer is formed on a substrate of a different material such as sapphire and thereon an epitaxial growth layer is formed. In the crystal growth method using a low temperature deposition buffer layer, deposition of AlN or GaN onto a sapphire substrate or such is first applied around 500° C. to form an amorphous film or a continuous film containing, in part, poly-crystals. By heating this deposition up to about 1000° C., a part of the deposition is evaporated away and the remains are converted into crystals to form crystal nuclei of high density. Application of those as nuclei for crystal growth leads to GaN layer of relatively high crystalline quality. Nevertheless, even using the method comprising the step of forming the low temperature deposition buffer layer, it still contains a considerable number of crystal defects such as threading dislocations and vacant pipes, and, thus, its crystalline quality is insufficient to provide such high performance devices as currently required.

Alternatively, another technique in which a GaN substrate is used as a substrate for crystal growth and thereon a semiconductor multi-layered film for constructing a device section is formed has been extensively studied. Such a GaN substrate for crystal growth is referred to as a self-supporting GaN substrate, hereinafter. Among techniques to prepare a self-supporting GaN substrate, the ELO (Epitaxial Lateral Overgrowth) technique is widely known. The ELO is a technique in which a mask layer having stripe openings is formed on a base substrate and, the lateral growth is initiated from the openings to attain a GaN layer with a few dislocations. In Japanese Patent Application Laid-open No. 251253/1999, it is proposed that a GaN layer is formed on a sapphire substrate using this ELO technique, and thereafter the sapphire substrate is removed by etching or such to prepare a self-supporting GaN substrate.

Meanwhile, the FIELO (Facet-Initiated Epitaxial Lateral Overgrowth) technique (A. Usui et al., Jpn. J. Appl. Phys., Vol. 36 (1997) pp. L899–L902) has been developed as one of the techniques progressed from the ELO technique. This technique shares common ground with the ELO in the point of carrying out the selective growth using a silicon oxide mask, but differs from the ELO in the point of forming facets, thereat, in mask opening sections. Formation of facets changes the propagation direction of dislocations and, thus, reduces the number of threading dislocations that reach the top of the epitaxial growth layer. With this method, a self-supporting GaN substrate of high quality having a relatively small number of crystal defects can be obtained by the process where a thick GaN layer is grown upon abase substrate of, for instance, sapphire, and subsequently the base substrate is removed from that.

BRIEF SUMMARY OF THE INVENTION

Object of the Invention

However, for the self-supporting GaN substrate fabricated in such a method, there still remain problems to be solved. The utmost problem is the occurrence of the warp. For instance, the self-supporting GaN substrate from which the sapphire substrate is removed is known to bow inwards like a concave, with the growth face topside. The radius of curvature of this bow may reach to the level of several tens cm or so. If this warp is severe, when it is used as a substrate on which a layered structure for the device is grown with a MOVPE apparatus or such, the substrate cannot adhere to its substrate holder and thereby the temperature distribution is generated, which makes the uniform distribution of composition and dopant density impossible to achieve. Further, because it becomes difficult to conduct lithography uniformly thereon, a yield for devices falls a great deal. Naturally, the smaller the extent of the bow is, the better it is, and it is desirable to make the radius of curvature not less than 1 m.

In light of the above problems, an object of the present invention is to provide a self-supporting substrate of group III nitride based semiconductor with a lessened bowing.

SUMMARY OF THE INVENTION

The studies by the present inventors revealed that the warp of the self-supporting substrate can be attributed to the variety of the dislocation density in the substrate, that is to say, the dislocation density (in particular, the density of edge dislocation) averaged over for the obverse surface of substrate differs from that for the reverse surface. In other words, the greater the difference between the dislocation densities of one surface of the substrate and of the other surface is, the more severe the degree of the bowing is. Accordingly, in order to reduce the warp, it becomes particularly important to control this distribution of dislocation densities.

An observation that a density gradient of dislocation or a difference in the edge dislocation density between one surface and the other surface results in the warp of the substrate may be explained in the following way. In a hexagonal crystal of GaN, when crystal grains are present with a high density, slight variations in orientation of crystal grains are induced by its lattice mismatch with the substrate of a different material, and thus, it may lead to numerous edge dislocations generated on their boundaries. A nearly linear relationship is found out between the edge dislocation density and the grain size, and also the following relationship equation is found to exist between the size do of this crystal grain and the amount E of the strain accumulated inside of the substrate:

$$\epsilon = \Delta/d_0 \quad (1)$$

wherein, $\Delta$ is almost equal to the Burger's vector of the edge dislocation. Therefore, assuming that there is difference between the dislocation densities on one surface and the other surface of a substrate, there is variety in the amount of the strain inside of the substrate, which brings about the generation of the warp.

In practice, when a self-supporting GaN substrate is fabricated by growing a GaN layer on a substrate of a different material by epitaxial growth and thereafter removing the substrate of the different material, the edge dislocation density on the interface between the substrate and the GaN layer becomes as high as $10^9$ to $10^{11}$ cm$^{-2}$ due to the lattice mismatch. Even with such crystals, the dislocation density on the top surface of the GaN layer may be lessened to such a low level as $10^5$–$10^7$ cm$^{-2}$ by various techniques of reducing the number of dislocations such as means of lateral growth or thick film growth. As for such a substrate warp, it is normally observed that the edge dislocation density is of about $10^9$ cm$^{-2}$ for one surface and of about $10^6$ cm$^{-2}$ for the other surface, respectively. In the case of a self-supporting GaN substrate with a thickness of 200 μm, the warp becomes very severe with a radius of curvature of 20 cm or the like so that it is difficult to present such a substrate for the device application as it is. Nevertheless, if the level of the edge dislocation density for the surface having the higher density side is reduced to $10^7$ cm$^{-2}$ or so, a marked improvement is made in respect of the bow, with the radius of curvature for the warp reaching to 10 m or so, and the substrate suitable for the device application can be obtained.

The reasons why the warp of the substrate can be suppressed specifically through the control of the edge dislocation density has been so far described, but the warp of the substrate can be similarly suppressed with effect through the control of the total dislocation density including the edge dislocation density.

Accordingly, the present invention is based on the view mentioned above; thereby the warp of the substrate is suppressed through the control of the total dislocation density and more particularly through the control of the edge dislocation density.

The present invention provides a group III nitride based semiconductor substrate which is a self-supporting substrate; wherein when a dislocation density of a surface thereof on a side of a lower dislocation density is designated $n_1$ and a dislocation density of a surface thereof on a side of a higher dislocation density is designated $n_2$, its ratio of $n_2/n_1$ is less than 750.

The present invention makes a marked improvement in respect of the warp of a substrate. Since its effect for reducing the warp is given stably, excellent stability for process may be also gained.

In the group III nitride based semiconductor substrate according to this invention, $n_1$ may be set preferably not greater than $1\times10^8$ cm$^{-2}$ and more preferably not greater than $1\times10^7$ cm$^{-2}$. This will achieve the suppression of the warp with effect, while realizing excellent crystalline quality.

The present invention provides further a group III nitride based semiconductor substrate which is a self-supporting substrate; wherein when an edge dislocation density of a surface thereof on a side of a lower edge dislocation density is designated $m_1$ and an edge dislocation density of a surface thereof on a side of a higher edge dislocation density is designated $m_2$, its ratio of $m_2/m_1$ is less than 1000.

This aspect of the present invention makes a marked improvement in respect of the warp of a substrate. Since its effect for reducing the warp is given stably, excellent stability for process may be also gained.

In the group III nitride based semiconductor substrate according to the present invention, $m_1$ may be set preferably not greater than $5\times10^7$ cm$^{-2}$ and more preferably not greater than $5\times10^6$ cm$^{-2}$. This can achieve the suppression of the warp with effect, while realizing excellent crystalline quality.

Further, the present invention provides a process for manufacturing a group III nitride based semiconductor substrate; which comprises the steps of:

forming a group III nitride based semiconductor layer on top of a substrate of a different material;

separating said substrate of the different material from said group III nitride based semiconductor layer; and applying a treatment to reduce a dislocation density onto a surface of said group III nitride based semiconductor layer which lies on a side from which said substrate of the different material has been separated.

Furthermore, the present invention provides a process for manufacturing a group III nitride based semiconductor substrate; which comprises the step of forming a group III nitride based semiconductor layer on top of a substrate of a different material by epitaxial growth, and thereafter separating said substrate of the different material from said group III nitride based semiconductor layer; wherein a heat treatment is carried out at a temperature not lower than 1150° C. either during the growth of said group III nitride based semiconductor layer or after the growth of said group III nitride based semiconductor layer. This process for manufacturing may further comprise the step of applying a treatment to reduce a dislocation density onto a surface of said group III nitride based semiconductor layer which lies on a side from which said substrate of the different material has been separated.

According to the process for manufacturing afore-mentioned, a self-supporting group III nitride based semiconductor substrate which is markedly improved in respect of the warp of the substrate can stably obtained.

In these processes for manufacturing a group III nitride based semiconductor substrate according to the present invention, they may have the constitution wherein said treatment to reduce a dislocation density comprises the step of removing a region of said group III nitride based semiconductor layer to a thickness not less than 100 μm from a side from which said substrate of the different material has been separated.

Further, in these processes for manufacturing a group III nitride based semiconductor substrate according to the present invention, they may have the constitution wherein said treatment to reduce a dislocation density comprises the step of applying a heat treatment onto said group III nitride based semiconductor layer at a temperature not lower than 1150° C. In this way, the dislocation densities can be decreased with effect. Herein, the duration for the treatment is preferably set 10 minutes or longer. Further, in view of the aim for reducing the number of dislocation densities stably, the heat treatment is more preferably conducted at a temperature not lower than 1200° C.

Besides, the dislocation density and the edge dislocation density as used in the present invention imply the density averaged over in a specific plane. For instance, in the case of group III nitride based semiconductor substrates fabricated by masked growth, with some methods of growing, there are occasions the dislocation density varies within a surface of a substrate. Even if such a variety in the in-plane distribution of dislocation density is present, the warp of the substrate can be reduced with effect by making the average dislocation density and the average edge dislocation density take the values within the respective ranges described above.

DETAILED DESCRIPTION OF THE INVENTION

Figure 1A:
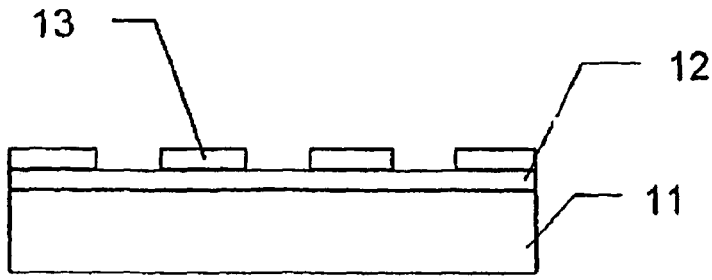
FIGS. 1(a)–(d) are a series of cross-sectional views illustrating the steps of one example of a process for manufacturing a self-supporting GaN substrate according to the present invention.

A "self-supporting" substrate as used in the present invention denotes any substrate that can maintain its own shape and has enough mechanical strength not to cause any inconvenience in handling. To have such a strength, a thickness of a self-supporting substrate is set to be preferably not less than 30 μm and more preferably not less than 50 μm. Further, taking such a factor as easiness of the cleavage after the device formation into consideration, the thickness of a self-supporting substrate is set to be preferably not greater than 1 mm and more preferably not greater than 300 μm. If the substrate is unduly thick, its cleavage becomes difficult to make, bringing about roughness on the cleaved facet. As a result, when applied to, for example, a semiconductor laser or such, there may arise a problem of degradation of the device formation resulting from the reflection loss.

For a group III nitride based semiconductor in the present invention, there can be given a semiconductor expressed by $In_xGa_yAl_{1-x-y}N$ ($0 \leq x \leq 1$, $0 \leq y \leq 1$, $0 \leq x+y > 1$). Among semiconductors of this sort, GaN, AlGaN and the like are preferably employed, as they well satisfy the qualities required for the substrate materials, including mechanical strength and manufacturing stability.

In the present invention, the warp of the substrate is suppressed through a reduction of the dislocation density in the self-supporting substrate, especially the edge dislocation density therein. For characterizing dislocations, the terms "edge" and "screw" are generally used. The edge dislocation and the screw dislocation represent cases in which the Burger's vector b is perpendicular and parallel to the running direction of the dislocation line, respectively. In the case that the dislocation has a mixture of characters of edge and screw, in other words, the Burger's vector b is oblique to the dislocation line, it is designated the "mixed dislocation". Now, there are occasions, within a line of a dislocation pattern, the direction of the dislocation line changes with respect to the direction of the Burger's vector b. The dislocation does not necessarily run in a straight line and often bends. In the extreme example, when the dislocation line forms a ring, the segments running parallel to the Burger's vector b are screw dislocations and the segments running perpendicular to Burner's vector b are edge dislocations. The "edge dislocation" as used in the present invention includes such a case, that is, only a part of the dislocation belongs to the edge dislocations.

The character of the dislocations may be identified, for instance, by using transmission electron microscopy (TEM). When the normal vector g (referred to as "diffraction vector", hereinafter) to the selected diffraction plane of lattice is perpendicular to the Burger's vector b of the dislocation line, in other words, the inner product of those vectors is zero (the diffraction vector g the Burger's vector b=0), the contrast for the dislocation vanishes out in the TEM observations. Making the use of this, the character (edge, screw or mixed) for unknown dislocations can be determined.

Further, the identification of the dislocation character may be also made from the result of observations for the shape and the depth of the etch pit which is formed through selective etching applied thereto with a solution of chemicals.

A self-supporting group III nitride based semiconductor substrate according to the present invention can be formed by growing a layer of group III nitride based semiconductor on a substrate of a different material by FIELO or pendeo-epitaxy and thereafter removing the substrate of the different material. When fabricated in such a method, a stable substrate with a low dislocation density on its surface can be manufactured. The FIELO is a method wherein a mask having a plurality of openings is first formed and, then, while forming a facet structure by setting the openings as its growth region, a GaN layer is grown by vapor phase deposition. GaN crystals grown from neighboring openings coalesce so that the propagation direction of dislocations are changed to the direction parallel to the substrate and a GaN layer with a low dislocation density on its surface can be attained. By separating this GaN layer from the substrate of the different material, a self-supporting GaN substrate of high quality can be obtained. Meanwhile, in the pendeo-epitaxy, a low temperature grown buffer layer made of $Al_xGa_{1-x}N$ ($0 \leq x \leq 1$) is first formed on a substrate of a different material and then a first crystalline layer made of $Al_yGa_{1-y}N$ ($0 \leq y \leq 1$) is formed thereon. After a mask having a plurality of stripe openings is formed on this crystalline layer, etching is performed to form the first $Al_yGa_{1-y}N$ layer patterned into stripe-shape. Next, by using this as an origin, crystals of $Al_zGa_{1-z}N$ ($0 \leq z \leq 1$) are grown with vapor phase deposition to form a second single crystalline layer made of a thick film of $Al_zGa_{1-z}N$. After that, by separating the second single crystalline layer form the substrate of the different material, a self-supporting substrate of high quality can be obtained.

However, when a substrate is fabricated by these methods, although its dislocations are reduced and excellent crystalline quality is attained, the degree of its warp shows a tendency to rise further. While dislocations on the surface for device formation are certainly reduced with effect, numerous dislocations on the surface opposite to the surface for device formation remain as they are. Therefore, a ratio of the dislocation density of the obverse surface of the substrate to that of the reverse surface becomes all the more greater than that for conventional one by the very attempt to reduce dislocations. When applied to such a substrate with reduced dislocations, the present invention can demonstrate marked effects and can suppress the warp effectively, while achieving excellent crystalline quality.

EXAMPLES

With reference to examples, the present invention is further explained in details below. The terms, the "total dislocation density" and the "edge dislocation density" as used in Examples imply the respective densities averaged over either the obverse surface or reverse surface of the substrate.

Example 1

In the present example, a self-supporting GaN substrate was fabricated by growing a GaN epitaxial layer on a sapphire substrate with the afore-mentioned FIELO and thereafter removing the sapphire substrate and the evaluation thereof was made. Referring to FIGS. 1(a)–1(d), a process for manufacturing a self-supporting GaN substrate according to the present example is explained below.

Figure 1B:
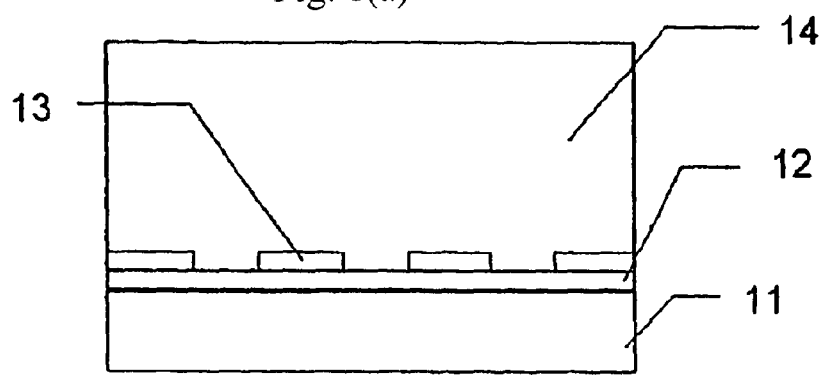
Figure 2:
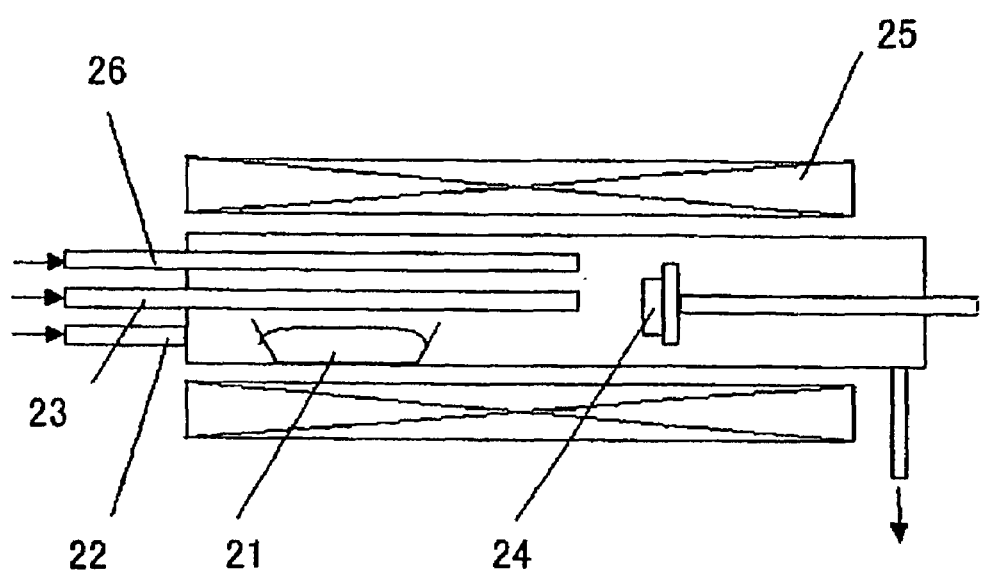
FIG. 2 is a schematic view showing a hydride vapor phase epitaxy apparatus used for the GaN growth as described in the Examples.

First, as shown in FIG. 1(a), using a sapphire substrate 11, a GaN epitaxial layer 12 was grown, and a silicon oxide mask 13 having stripe openings was formed thereon, and then, the substrate was set into a HVPE deposition apparatus as shown in FIG. 2. This apparatus enables GaCl which is a halide of a group III element to carry onto the substrate 24, and GaCl itself was formed, thereon, by the reaction of Ga metal 21 with HCl that was supplied together with a carrier gas of $H_2$ or $N_2$ through a supply tube 22. In the substrate area thereof, GaCl and $NH_3$ that was supplied through a supply tube 23 were mixed, and, by reaction of those, GaN was formed on a substrate 24 by vapor phase deposition. The temperature of the substrate area was set to be at 1000° C. by heating with an electric furnace 25. Further, the partial pressures of GaCl and $NH_3$ for the source materials were $5 \times 10^{-3}$ atm and 0.3 atm, respectively. Under these conditions, the growth rate thereof was approximately 50 μm/h. Doping was carried out by supplying $SiH_2Cl_2$ as a doping source gas for the substrate area through a doping gas supply tube 26 and a Si-doped GaN layer 14 with a thickness of approximately 350 μm was grown, as shown in FIG. 1(b).

Figure 1C:
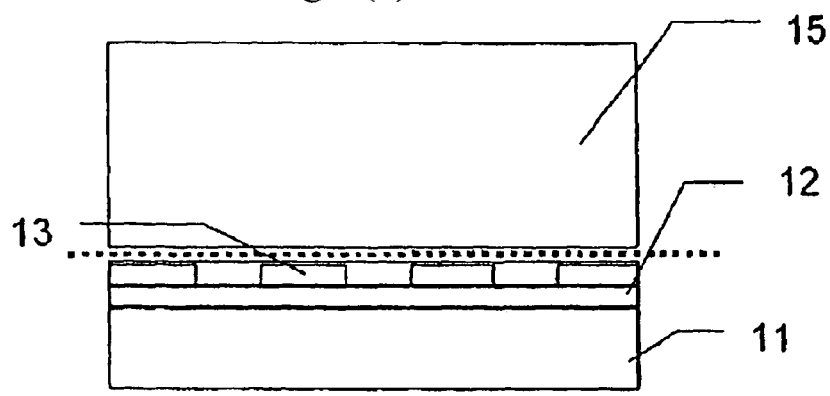

Now, this substrate was taken out of a reactor and, as shown in FIG. 1(c), the sapphire substrate as well as a portion of the GaN layer within a thickness of several μm or so were removed from the thick layer and thereby a self-supporting GaN substrate 15 was obtained. As a method of removing a sapphire substrate, it is possible to employ, for instance, means of mechanical polishing or etching with a strong basic or strong acidic chemical. Further, physical etching with charged particle beam or a neutral particle beam may be also used. In addition, the sapphire substrate can be removed by applying thereto an ultraviolet laser beam which can transmit through the sapphire substrate but is absorbed by GaN and thereby melting its portion close to the interface.

The examination of the dislocation densities in this self-supporting GaN substrate 15 showed that the density for the surface from which the sapphire substrate had been removed was valued at $5 \times 10^9$ cm$^{-2}$, while the density for the growth front face was valued at $1 \times 10^6$ cm$^{-2}$. Among them, the densities of edge dislocations alone for the rear and the front were valued at $4.5 \times 10^9$ cm$^{-2}$ and $3.5 \times 10^5$ cm$^{-2}$, respectively. Transmission electron microscopy (TEM) observation were performed on the lower surface and vertical section to determine the dislocation densities, for in particular, the substrate reverse surface and in general for surfaces when dislocation density exceeds $10^8$ cm$^{-2}$. However, when the dislocation density did not exceed $10^8$ cm$^{-2}$, selective etching with a chemical solution was first applied thereto and the number of etch pits formed thereby was counted, using either an optical microscope or a scanning electron microscope. The shapes of etch pits can be roughly classified into two groups and with the group having respective shallow pits correspond to edge dislocations. This classification can be verified as follows. When a dark-field image is taken for a vertical section of a sample showing an etch pit using the transmission electron microscopy, the Burger's vector of the dislocation can determined on the basis of the relationship between the g vector of the electron beam and the direction of the dislocation line therein, and, with this result, the character of that dislocation can be identified.

The measurement of the warp of the fabricated self-supporting GaN substrate 15 indicated that its radius of curvature was valued 30 cm. For the method for this warp measurement, good accurate results can be easily gained, for example, by the X-ray rocking curve measurement. In short, the change in Bragg angle $\theta_B$ is monitored, while the sample with a warp is moved by x in the transverse direction, and the radius of curvature ρ can be given by the relationship equation:

$(1/\rho) = d\theta_B/dx$.

Figure 1D:
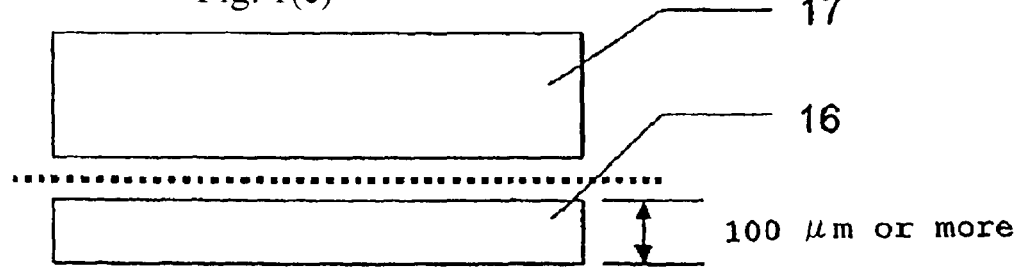

Next, as shown in FIG. 1(d), from the surface from which the sapphire substrate had been removed, a region 16 up to about 150 μm thickness was removed, and thereby a self-supporting GaN substrate 17 was obtained. For this removal, molten KOH was used. Because this etchant can etch only N-plane selectively, it can be conveniently used especially for etching of the reverse surface (the side opposite to the growth front face) of the GaN layer. Moreover, without selectivity for etching, it is still possible to apply chemical etching onto GaN reverse surface, if a protective film of $SiO_2$ or such is formed over the GaN obverse surface, and besides the removal can be made even by mechanical polishing.

As a result, in the self-supporting GaN substrate 17, the total dislocation density and the edge dislocation density for the surface from which the sapphire substrate had been removed decreased to $5\times10^7$ cm$^{-2}$ and $3\times10^7$ cm$^{-2}$, respectively. When measured the warp of this substrate, it measured a radius of curvature of 5 m, showing a marked improvement with respect to the warp. On this substrate, a layered structure for an InGaN based laser was grown and the laser was fabricated by way of trial. As the lessened warp did not adversely affect uniformity of exposure at the step of lithography, the production yield increased a great deal.

Example 2

Figure 4A:
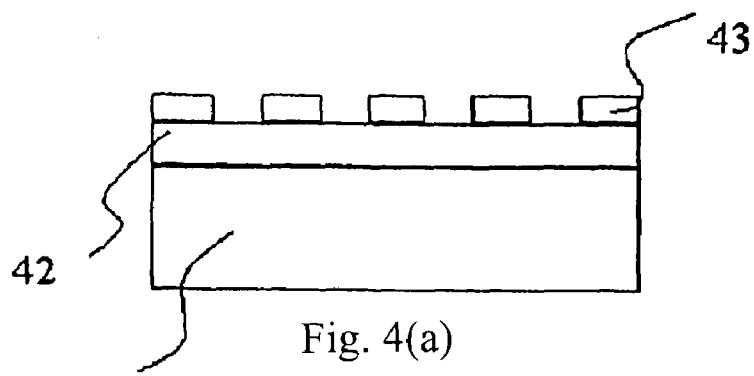
FIGS. 4(a)–(c) are a series of cross-sectional views illustrating the steps of another example of a process for manufacturing a self-supporting GaN substrate according to the present invention.
Figure 4B:
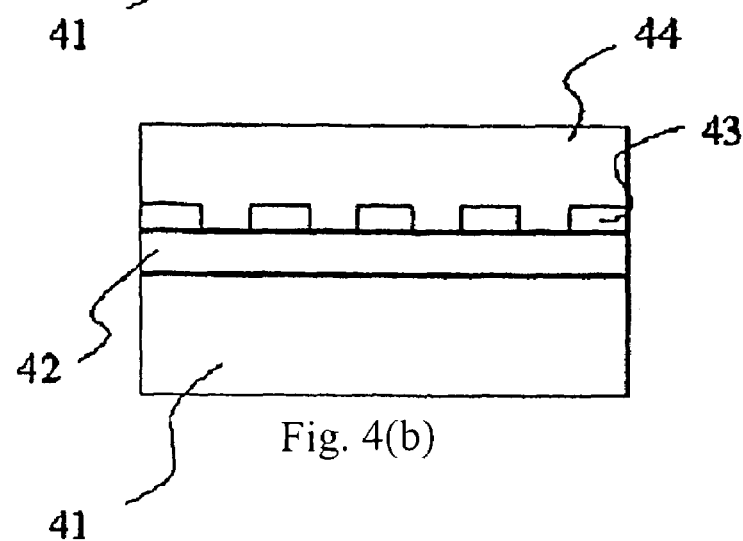
Figure 4C:
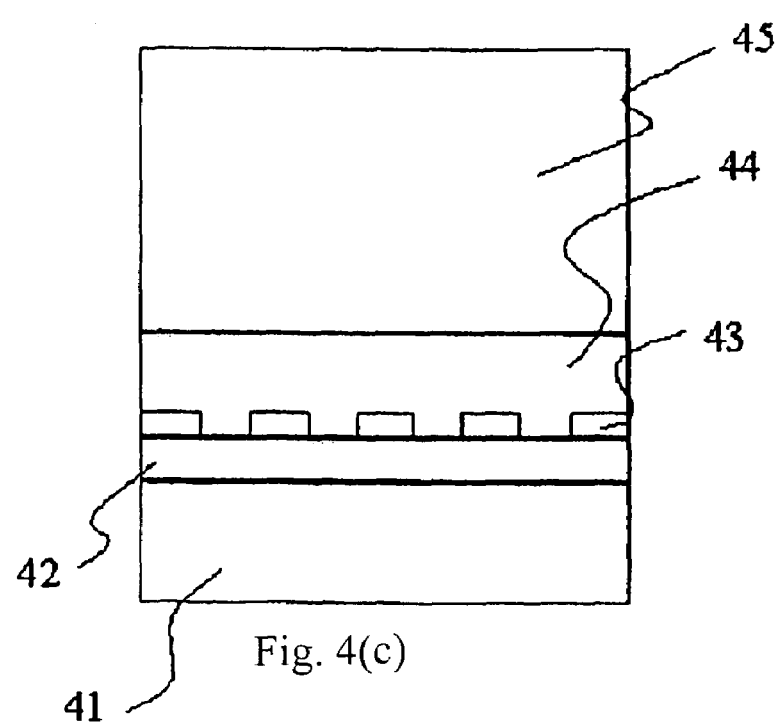

In the present example, a self-supporting GaN substrate was fabricated by growing a GaN epitaxial layer on a sapphire substrate with the afore-mentioned ELO technique (S. Nakamura, et al., MRS Internet. J. Nitride Semicond. Res., 4S1, G1. 1 (1999)), and thereafter removing the sapphire substrate and the evaluation thereof was made. Referring to FIGS. 4(a)–4(c), a process for manufacturing a self-supporting GaN substrate according to the present example is explained below.

First, using a sapphire substrate 41, a thin GaN layer 42 was epitaxially grown and thereon a silicon oxide mask 43 having stripe openings in the [1-100] direction of GaN was formed, and then, by the MOVPE method using trimethylgallium (TMGa) and NH$_3$ as the main source material, a flat GaN layer 44 was grown to a thickness of 10 μm, as shown in FIG. 4(b).

Next, this substrate was set into the afore-mentioned HVPE growth apparatus shown in FIG. 2. The temperature of the substrate area was set to be at 1000° C. by heating with the electric furnace 25. Further, the partial pressures of GaCl and NH$_3$ for the source materials were $5\times10^{-3}$ atm and 0.3 atm, respectively. Under these conditions, the growth rate thereof was approximately 50 μm/h. Further, doping was carried out by supplying SiH$_2$Cl$_2$ as a doping source gas for the substrate area through the doping gas supply tube 26 and a Si-doped GaN layer 45 with a thickness of approximately 350 μm was grown, as shown in FIG. 4(c). After that, this substrate was taken out of the reactor and, in a similar manner to that shown in FIG. 1(c), the sapphire substrate as well as a GaN layer with a thickness of several μm or so were removed from the thick layer and thereby a GaN layer 45 in the form of a self-supporting substrate was obtained. As a method of removing a sapphire substrate, it is possible to employ, for instance, means of mechanical polishing or etching with a strong basic or strong acidic chemical. Further, physical etching with s charged particle beam or a neutral particle beam can be also used. In addition, the sapphire substrate can be removed by applying thereto an ultraviolet laser beam which can transmit through the sapphire substrate but is absorbed by GaN and thereby melting its portion close to the interface. The examination of the dislocation densities in this GaN layer 45 showed that the density for the surface from which the sapphire substrate had been removed was valued at $1.5\times10^9$ cm$^{-2}$, while the density for the growth front face was valued at $2\times10^6$ cm$^{-2}$. Among them, the densities of edge dislocations alone for the rear and the front were valued at $1\times10^9$ cm$^{-2}$ and $1\times10^6$ cm$^{-2}$, respectively.

The measurement of the warp of the fabricated GaN layer 45 (self-supporting GaN substrate) indicated that its radius of curvature was valued 1 m.

Next, in a similar manner to that shown in FIG. 1(d), from the surface from which the sapphire substrate had been removed, a region was removed up to about 150 μm thickness. For this removal, molten KOH was used. Because this etchant can etch only N-plane selectively, it can be conveniently used especially for etching of the reverse surface (the side opposite to the growth front face) of the GaN layer. Moreover, without selectivity for etching, it is still possible to apply chemical etching onto GaN reverse surface, if a protective film of SiO$_2$ or such is formed over the GaN obverse surface, and besides the removal can be made even by mechanical polishing.

As a result, in the GaN layer 45, the total dislocation density and the edge dislocation density for the surface from which the sapphire substrate had been removed decreased to $5\times10^8$ cm$^{-2}$ and $2.5\times10^8$ cm$^{-2}$, respectively. When measured the warp of this substrate, it measured a radius of curvature of 3 m, showing a marked improvement with respect to the warp. On this substrate, a layered structure for an InGaN based laser was grown and the laser was fabricated by way of trial. As the lessened warp did not adversely affect uniformity of exposure at the step of lithography, the production yield increased a great deal.

Example 3

Figure 5A:
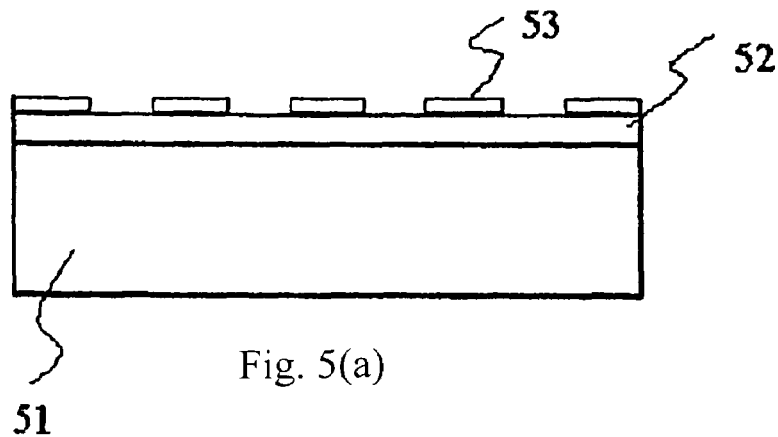
FIGS. 5(a)–(c) are a series of cross-sectional views illustrating the steps of another example of a process for manufacturing a self-supporting GaN substrate according to the present invention.
Figure 5B:
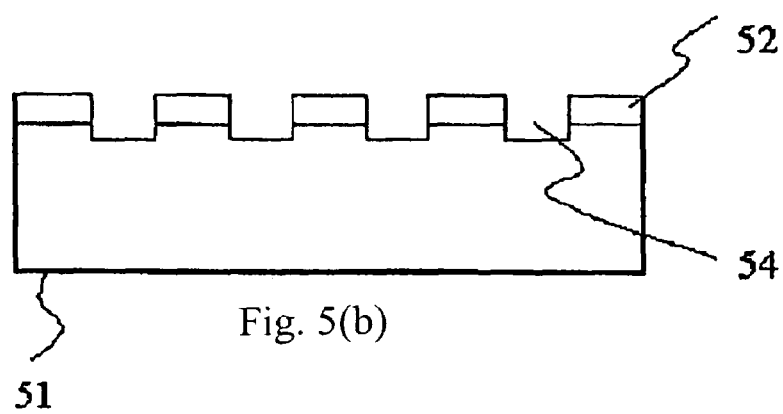
Figure 5C:
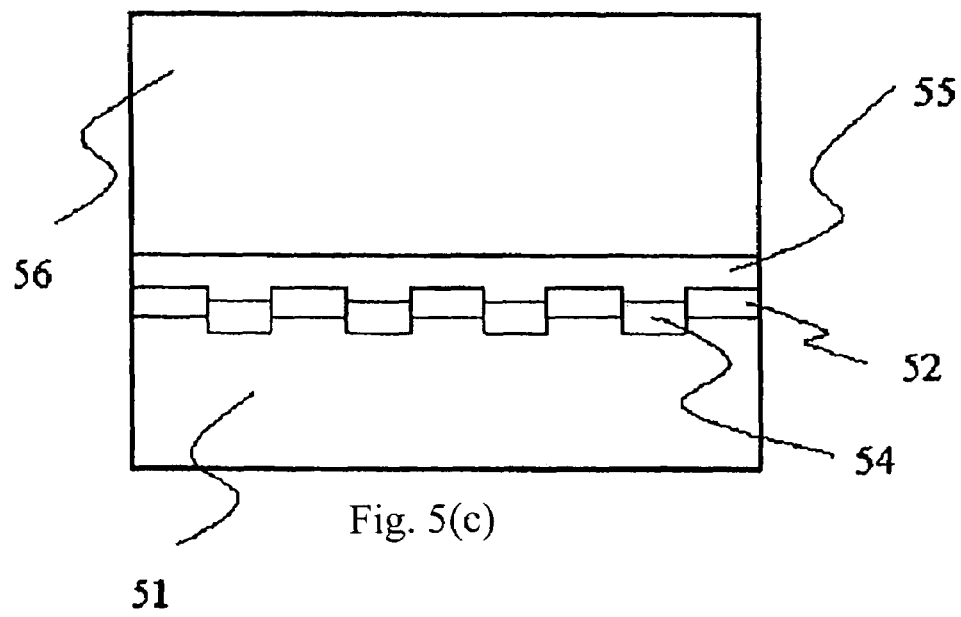

In the present example, a self-supporting GaN substrate was fabricated by growing a GaN epitaxial layer on a sapphire substrate with a technique called PENDEO (T. S. Zheleva, MRS Internet. J. Nitride Semicond. Res., 4S1, G3. 38 (1999)), and thereafter removing the sapphire substrate and the evaluation thereof was made. Referring to FIGS. 5(a)–5(c), a process for manufacturing a self-supporting GaN substrate according to the present example is explained below.

First, using a sapphire substrate 51, upon a thin GaN layer 52 a silicon oxide mask 53 having stripe openings in the [1-100] direction of GaN was formed, and thereafter, by means of dry etching or such, some parts of the GaN epitaxial layer 52 and some parts 54 of the sapphire substrate therein were etched, as shown in FIG. 5(b). Next, by the MOVPE method using trimethylgallium (TMGa) and NH$_3$ as the main source material, a flat GaN layer 55 was grown to a thickness of 10 μm, as shown in FIG. 5(c). Parts of dry etched sections remained as gap space.

This substrate was set into the HVPE growth apparatus shown in FIG. 2. The temperature of the substrate area in the apparatus was set to be at 1000° C. by heating with an electric furnace 25. Further, the partial pressures of GaCl and NH$_3$ for the source materials were $5\times10^{-3}$ atm and 0.3 atm, respectively. Under these conditions, the growth rate thereof was approximately 50 μm/h. Further, doping was carried out by supplying SiH$_2$Cl$_2$ as a doping source gas for the substrate area through the doping gas supply tube 26 and a Si-doped GaN layer 45 with a thickness of approximately 350 μm was grown, as shown in FIG. 5(c).

This substrate was taken out of the reactor and, in a similar manner to that shown in FIG. 1(c), the sapphire substrate as well as a GaN layer with a thickness of several μm or so were removed from the thick layer and thereby a GaN layer 56 in the form of a self-supporting substrate was obtained. As a method of removing a sapphire substrate, it is possible to employ, for instance, means of mechanical polishing or etching with a strong basic or strong acidic chemical. Further, physical etching with s charged particle beam or a neutral particle beam can be also used. In addition, the sapphire substrate can be removed by applying thereto an ultraviolet laser beam which can transmit through the sapphire substrate but is absorbed by GaN and thereby melting its portion close to the interface. The examination of the dislocation densities in this GaN layer 56 showed that the density for the surface from which the sapphire substrate had been removed was valued at $3\times10^9$ cm$^{-2}$, while the density for the growth front face was valued at $3\times10^6$ cm$^{-2}$. Among them, the densities of edge dislocations alone for the rear and the front were valued at $2.4\times10^9$ cm$^{-2}$ and $1.2\times10^6$ cm$^{-2}$, respectively.

The measurement of the warp of the fabricated GaN layer 56 in the form of a self-supporting substrate indicated that its radius of curvature was valued 80 cm.

Next, in a similar manner to that shown in FIG. 1(d), from the surface from which the sapphire substrate had been removed, a region was removed up to about 150 μm thickness. For this removal, molten KOH was used. Because this etchant can etch only N-plane selectively, it can be conveniently used especially for etching of the reverse surface (the side opposite to the growth front face) of the GaN layer. Moreover, without selectivity for etching, it is still possible to apply chemical etching onto GaN reverse surface, if a protective film of $SiO_2$ or such is formed over the GaN obverse surface, and besides the removal can be made even by mechanical polishing.

As a result, in the GaN layer 56, the total dislocation density and the edge dislocation density for the surface from which the sapphire substrate had been removed decreased to $3.5\times10^8$ cm$^{-2}$ and $1\times10^8$ cm$^{-2}$, respectively. When measured the warp of this substrate, it measured a radius of curvature of 4 m, showing a marked improvement with respect to the warp.

On this substrate, a layered structure for an InGaN based laser was grown and the laser was fabricated by way of trial. As the lessened warp did not adversely affect uniformity of exposure at the step of lithography, the production yield increased a great deal.

Example 4

Figure 3A:
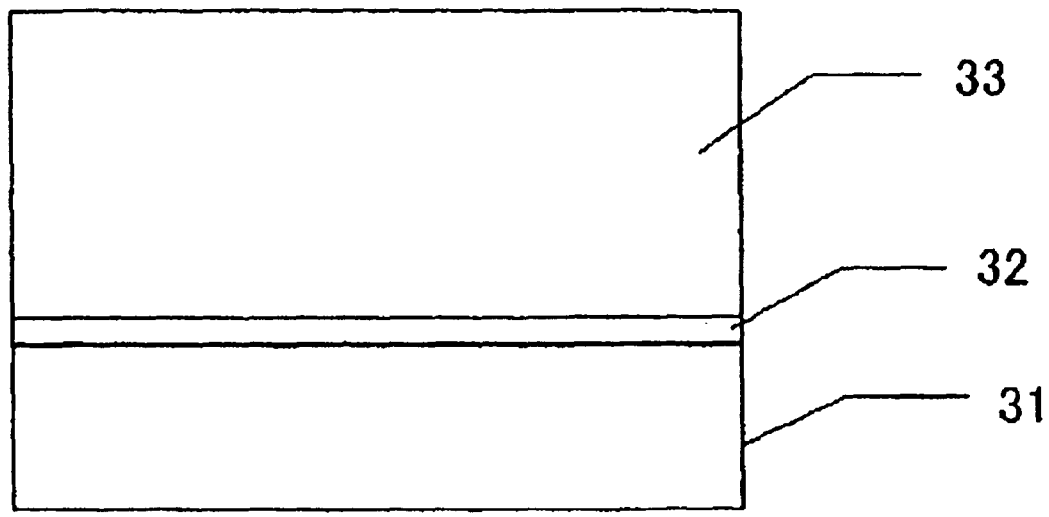
FIGS. 3(a) & (b) are a series of cross-sectional views illustrating the steps of another example of a process for manufacturing a self-supporting GaN substrate according to the present invention.
Figure 3B:
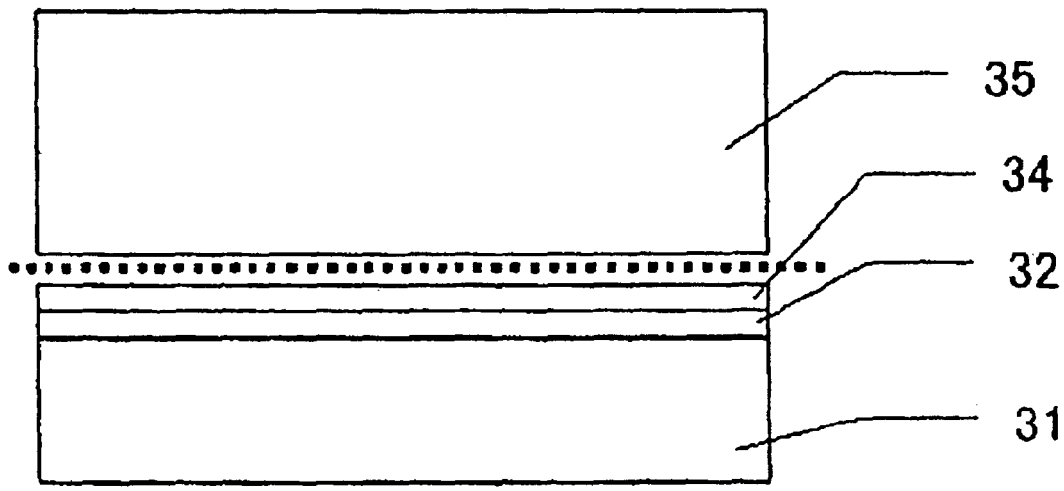

In the present example, the dislocation densities of the surfaces of a self-supporting substrate were controlled by a heat treatment. Referring to FIGS. 3(a)–3(b), a process for manufacturing a self-supporting GaN substrate according to the present example is explained below.

First, using a sapphire substrate 31, a GaN layer 33 was formed on a GaN low temperature growth buffer layer 32 with the afore-mentioned HVPE growth apparatus of FIG. 2 (FIG. 3(a)). In the substrate area inside of the apparatus, GaCl and $NH_3$ that was supplied through a supply tube 23 were mixed, and, while interacting, formed GaN on a substrate 24 by vapor deposition. The temperature of the substrate area was set to be at 1000° C. using an electric furnace 25. Further, the partial pressures of GaCl and $NH_3$, both of which were the source gases, were $5\times10^{-3}$ atm and 0.3 atm, respectively. Under these conditions, the growth rate thereof was approximately 50 μm/h. Further, doping was carried out by supplying $SiH_2Cl_2$ as a doping source gas for the substrate area through the doping gas supply tube 26. In this way, a Si-doped GaN layer 33 with a thickness of approximately 200 μm was epitaxially grown.

After that, this substrate was taken out of the reactor, and the sapphire substrate 31, the GaN low temperature grown buffer layer 32 and a small portion of the GaN layer 33 were removed (FIG. 3(b)). Therefore, the GaN layer 33 shown in FIG. 3(a) were, in FIG. 3(b), divided into a self-supporting GaN substrate 35 and a GaN layer 34 that had been removed from the self-supporting GaN substrate. The GaN layer 34 to be removed was set to be several tens μm or so in thickness.

As a method of removing the sapphire substrate 31, it is possible to employ, for instance, means of mechanical polishing or etching with a strong basic or strong acidic chemical. Further, physical etching with s charged particle beam or neutral particle beam can be also used. In addition, the sapphire substrate can be removed by applying thereto an ultraviolet laser beam which can transmit through the sapphire substrate but is absorbed by GaN and thereby melting its portion close to the interface.

The examination of the dislocation densities in the self-supporting GaN substrate 35 obtained in the process described above showed that the density for the surface from which the sapphire substrate had been removed was valued at $9\times10^9$ cm$^{-2}$, while the density for the growth front face was valued at $1\times10^7$ cm$^{-2}$. Among them, the densities of edge dislocations alone for the rear and the front were valued at $7\times10^9$ cm$^{-2}$ and $5\times10^6$ cm$^{-2}$, respectively. The measurement of the warp of the self-supporting GaN substrate 35 indicated that its radius of curvature was valued at as a large value as 90 cm.

This self-supporting GaN substrate 35 was put into an electric furnace and a heat treatment was carried out under the $NH_3$ atmosphere at 1200° C. for 24 hours. The $NH_3$ atmosphere was selected for preventing decomposition during the heat treatment, but if the sample could be sealed well, $NH_3$ supply was not necessarily required. After the heat treatment, the dislocation densities were again examined, and it was found that the dislocation density for the surface from which the sapphire substrate had been removed became $4\times10^7$ cm$^{-2}$, while the density for the growth front face became $8\times10^5$ cm$^{-2}$, showing a marked improvement in dislocation densities. Among them, the densities of edge dislocations alone for the rear and the front were valued at $1\times10^7$ cm$^{-2}$ and $3\times10^5$ cm$^{-2}$, respectively. When measured the warp of the self-supporting GaN substrate 35 after the heat treatment, it measured a radius of curvature of 6 m, showing a marked improvement with respect to the warp.

On this substrate, a layered structure for an InGaN based laser was grown and the laser was fabricated by way of trial. As the lessened warp did not adversely affect uniformity of exposure at the step of lithography, the production yield increased a great deal.

Example 5

In the present example, the dislocation densities of the surfaces of a self-supporting substrate were controlled by a step of heat treatment adding in the midst of epitaxial growth. A process for manufacturing a self-supporting GaN substrate according to the present example is explained below.

Figure 6:
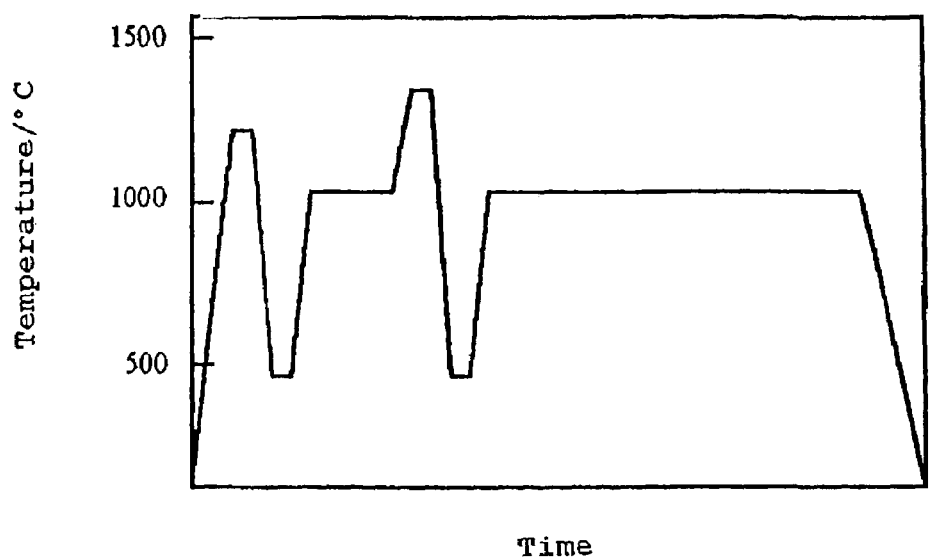
FIG. 6 is a diagram in explaining one example of a temperature profile employed in a process for manufacturing a self-supporting GaN substrate according to the present invention.

In the present example, using a sapphire C-plane substrate, a GaN layer was grown by the step shown in FIG. 3 with the afore-mentioned HVPE apparatus of FIG. 2. Hereat, the growth of the GaN layer 33 and a heat treatment were carried out according to the temperature sequence shown in FIG. 6. During the growth, the partial pressures of GaCl and $NH_3$ were set to be $5\times10^{-3}$ atm and 0.3 atm, respectively.

First, the temperature in a furnace was set at 1200° C. and thermal cleaning of the sapphire substrate was conducted in $H_2$ gas flow. Next, the temperature in the furnace was lowered to 500° C. and a deposition of a GaN low temperature grown buffer layer 32 was made. After that, the temperature in the furnace was raised to 1000° C. and a GaN layer was grown to a thickness of 50 μm. Hereat, the Ga source supply was stopped once and a heat treatment was performed. That is, the temperature in the furnace was raised to 1400° C. under the NH$_3$ atmosphere and was kept for 10 minutes. Following that, the temperature in the furnace was lowered to 500° C. and kept for 5 minutes. After this sequence of a heat treatment was completed, the temperature in the furnace was again raised to 1000° C. Subsequently, a GaN layer was grown further as thick as 150 μm and, thus, a GaN layer 33 with a total film thickness of 200 μm was obtained.

After that, this substrate was taken out of a reactor and, the sapphire substrate 31, the GaN low temperature grown buffer layer 32 and a small portion of the GaN layer 33 were removed (FIG. 3(b)). Here, the GaN layer 33 shown in FIG. 3(a) were, in FIG. 3(b), divided into a self-supporting GaN substrate 35 and a GaN layer 34 that had been removed from the self-supporting GaN substrate. The GaN layer 34 to be removed was set to be several tens μm or so in thickness. As a method of removing the sapphire substrate 31, one of the afore-mentioned methods can be employed.

The examination of the dislocation densities in the self-supporting GaN substrate 35 obtained in the process described above showed that the density for the surface from which the sapphire substrate had been removed was valued at $4 \times 10^7$ cm$^{-2}$, while the density for the growth front face was valued at $5 \times 10^6$ cm$^{-2}$. Among them, the densities of edge dislocations alone for the rear and the front were valued at $1.5 \times 10^7$ cm$^{-2}$ and $2 \times 10^6$ cm$^{-2}$, respectively. The measurement of the warp of the GaN layer indicated that its radius of curvature was valued at 7 m. When the layer was grown without performing the heat treatment step, the density for the surface from which the sapphire substrate had been removed was valued at $9 \times 10^9$ cm$^{-2}$, while the density for the growth front face was valued at $1 \times 10^7$ cm$^{-2}$. Among them, the densities of edge dislocations alone for the rear and the front were valued at $7 \times 10^9$ cm$^{-2}$ and $5 \times 10^6$ cm$^{-2}$, respectively. The measurement of the warp of this GaN layer indicated that it is a substrate having a severe warp with its radius of curvature of 90 cm, and, thus, confirmed that a marked improvement with respect to the warp was certainly made by an addition of the step of a heat treatment.

Example 6

In the present example, the dislocation densities of the surfaces of a self-supporting substrate were controlled with a higher accuracy by a plurality of steps of heat treatment adding in the midst of epitaxial growth. A process for manufacturing a self-supporting GaN substrate according to the present example is explained below.

Figure 7:
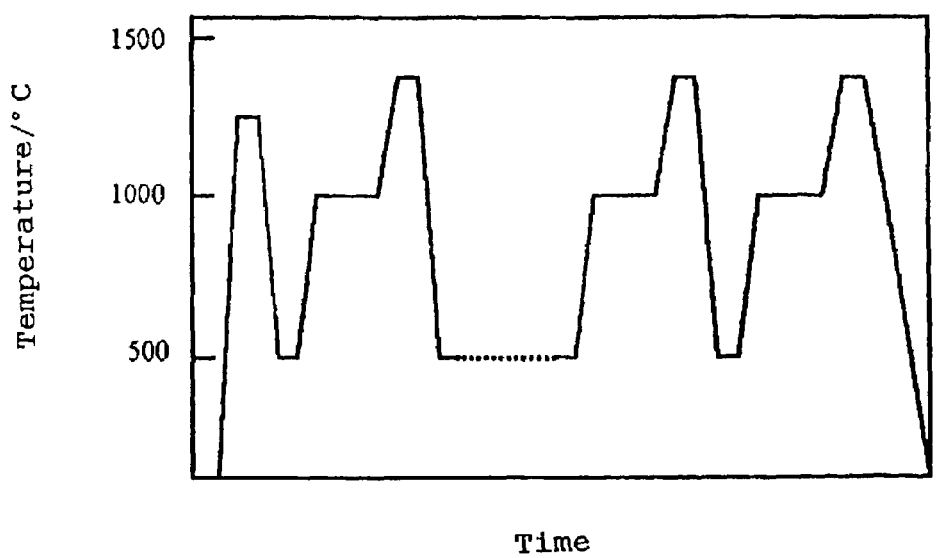
FIG. 7 is a diagram in explaining another example of a temperature profile employed in a process for manufacturing a self-supporting GaN substrate according to the present invention.

In the present example, using a sapphire C-plane substrate, a GaN layer was grown by the step shown in FIG. 3 with the afore-mentioned HVPE apparatus of FIG. 2. Hereat, the growth of the GaN layer 33 and heat treatments were carried out according to the temperature sequence shown in FIG. 7. During the growth, the partial pressures of GaCl and NH$_3$ were set to be $5 \times 10^{-3}$ atm and 0.3 atm, respectively.

First, the temperature in a furnace was set at 1200° C. and thermal cleaning of the sapphire substrate was conducted in H$_2$ gas flow. Next, the temperature in the furnace was lowered to 500° C. and a deposition of a GaN low temperature grown buffer layer 32 was made. After that, the temperature in the furnace was raised to 1000° C. and a GaN layer was grown to a thickness of 25 μm. Hereat, the Ga source supply was stopped once and a heat treatment was performed. That is, the temperature in the furnace was raised to 1400° C. under the NH$_3$ atmosphere and was kept for 10 minutes. Following that, the temperature in the furnace was lowered to 500° C. and kept for 5 minutes. After this sequence of a heat treatment was completed, the temperature in the furnace was again raised to 1000° C. Hereafter, every time the GaN layer was grown further to add a thickness of 25 μm, a growth interruption and a subsequent heat treatment were similarly carried out, and a GaN layer 33 with a total film thickness of 200 μm was obtained.

After that, this substrate was taken out of a reactor and, the sapphire substrate 31, the GaN low temperature grown buffer layer 32 and a small portion of the GaN layer 33 were removed (FIG. 3(b)). Here, the GaN layer 33 shown in FIG. 3(a) were, in FIG. 3(b), divided into a self-supporting GaN substrate 35 and a GaN layer 34 that had been removed from the self-supporting GaN substrate. The GaN layer 34 to be removed was set to be several tens gm or so in thickness. As a method of removing the sapphire substrate 31, one of the afore-mentioned methods can be employed.

The examination of the dislocation densities in the self-supporting GaN substrate 35 obtained in the process described above showed that the density for the surface from which the sapphire substrate had been removed was valued at $2 \times 10^7$ cm$^{-2}$, while the density for the growth front face was valued at $4 \times 10^6$ cm$^{-2}$. Among them, the densities of edge dislocations alone for the rear and the front were valued at $9 \times 10^6$ cm$^{-2}$ and $1.5 \times 10^6$ cm$^{-2}$, respectively. The measurement of the warp of the GaN layer indicated that its radius of curvature was valued at 10 m. When the layer was grown without performing any heat treatment steps, the density for the surface from which the sapphire substrate had been removed was valued at $9 \times 10^9$ cm$^{-2}$, while the density for the growth front face was valued at $1 \times 10^7$ cm$^{-2}$. Among them, the densities of edge dislocations alone for the rear and the front were valued at $7 \times 10^9$ cm$^{-2}$ and $5 \times 10^6$ cm$^{-2}$, respectively. The measurement of the warp of this GaN layer indicated that it is a substrate having a severe warp with its radius of curvature of 90 cm, and, thus, confirmed that a marked improvement with respect to the warp was certainly made by an addition of the steps of heat treatment.

Example 7

In the present example, the dislocation densities of the surfaces of a self-supporting substrate were controlled by conducting such a heat treatment. On application of the heat treatment to the self-supporting substrate, the face used for device formation was covered with a mask. A process for manufacturing a self-supporting GaN substrate according to the present example is explained below.

In the present example, using a sapphire C-plane substrate, a GaN layer was grown by the step shown in FIG. 3 with the afore-mentioned HVPE apparatus of FIG. 2. First, upon a sapphire substrate 31, a GaN low temperature grown buffer layer 32 was formed. Subsequently, a GaN layer 33 was grown as follows. Firstly, in the apparatus of FIG. 2, the temperature of the substrate area was set to be at 1000° C. by heating with an electric furnace 25, and the partial pressures of the substrate area for GaCl and NH$_3$, both of which were the source gases, were set to be $5 \times 10^{-3}$ atm and 0.3 atm, respectively. Under these conditions, the growth rate thereof was approximately 50 μm/h. Further, Doping was carried out by supplying SiH$_2$Cl$_2$ as a doping source gas for the substrate area through the doping gas supply tube 26. In this way, a Si-doped GaN layer 33 with a thickness of approximately 200 μm was grown.

After that, this substrate was taken out of a reactor and, the sapphire substrate 31, the GaN low temperature grown buffer layer 32 and a small portion of the GaN layer were removed (FIG. 3(b)). Here, the GaN layer 33 shown in FIG.

3(a) were, in FIG. 3(b), divided into a self-supporting GaN substrate 35 and a GaN layer 34 that had been removed from the self-supporting GaN substrate. The GaN layer 34 to be removed was set to be several tens μm or so in thickness. As a method of removing the sapphire substrate 31, one of the afore-mentioned methods can be employed.

The examination of the dislocation densities in the self-supporting GaN substrate 35 obtained in the steps described above showed that the density for the surface from which the sapphire substrate had been removed was valued at $9 \times 10^9$ cm$^{-2}$, while the density for the growth front face was valued at $1 \times 10^7$ cm$^{-2}$. Among them, the densities of edge dislocations alone for the rear and the front were valued at $7 \times 10^9$ cm$^{-2}$ and $5 \times 10^6$ cm$^{-2}$, respectively. The measurement of the warp of this GaN layer indicated that it is a substrate having a large warp with its radius of curvature of 90 cm, Next, the entire surface of this self-supporting GaN substrate 35 was covered with a SiO$_2$ film. The deposition of the film was made by the CVD (Chemical Vapor Deposition). This could prevent decomposition of the GaN substrate even when a heat treatment was carried out at a considerably high temperature. Subsequently, this self-supporting GaN substrate 35 was put into an electric furnace and a heat treatment was carried out in the air at 1600° C. for 2 hours. After the heat treatment, the dislocation densities were again examined, and it was found that the density for the surface from which the sapphire substrate had been removed became $6 \times 10$ cm$^{-2}$, while the density for the growth front face became $9 \times 10^5$ cm$^{-2}$, showing a marked improvement in dislocation densities. Among them, the densities of edge dislocations alone for the rear and the front were valued at $4 \times 10^7$ cm$^{-2}$ and $3.5 \times 10^5$ cm$^{-2}$, respectively. When measured the warp of the self-supporting GaN substrate 35 after the heat treatment, it measured a radius of curvature of 3.5 m, showing a marked improvement with respect to the warp. On this substrate, a layered structure for an InGaN based laser was grown and the laser was fabricated by way of trial. As the lessened warp did not adversely affect uniformity of exposure at the step of lithography, the production yield increased a great deal.

Figure 8:
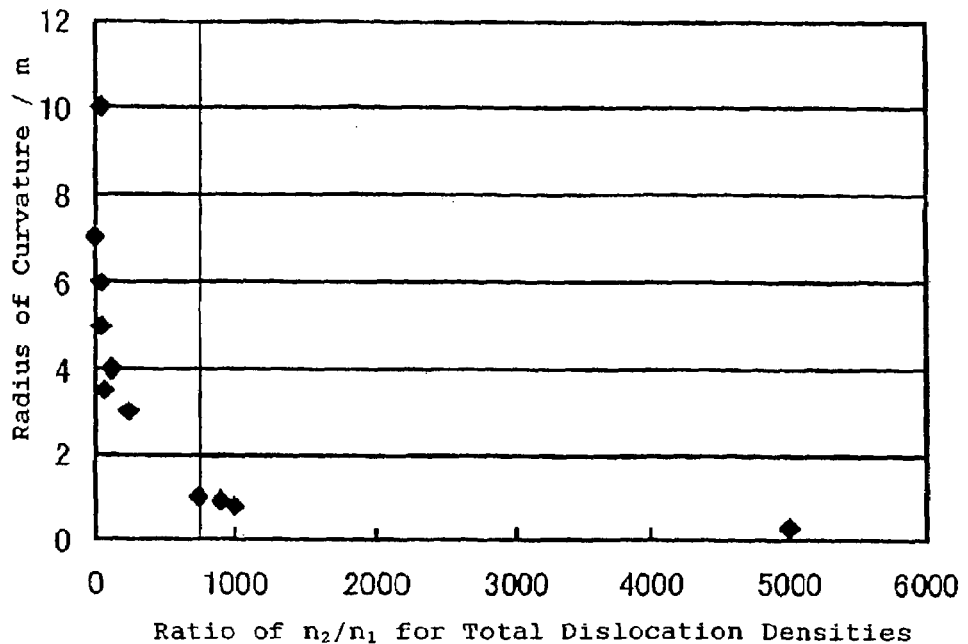
FIG. 8 is a plot showing the dependence of the radius of curvature of the substrate on the ratio of the total dislocation densities observed on the obverse surface and the reverse surface in the self-supporting GaN substrate.
Figure 9:
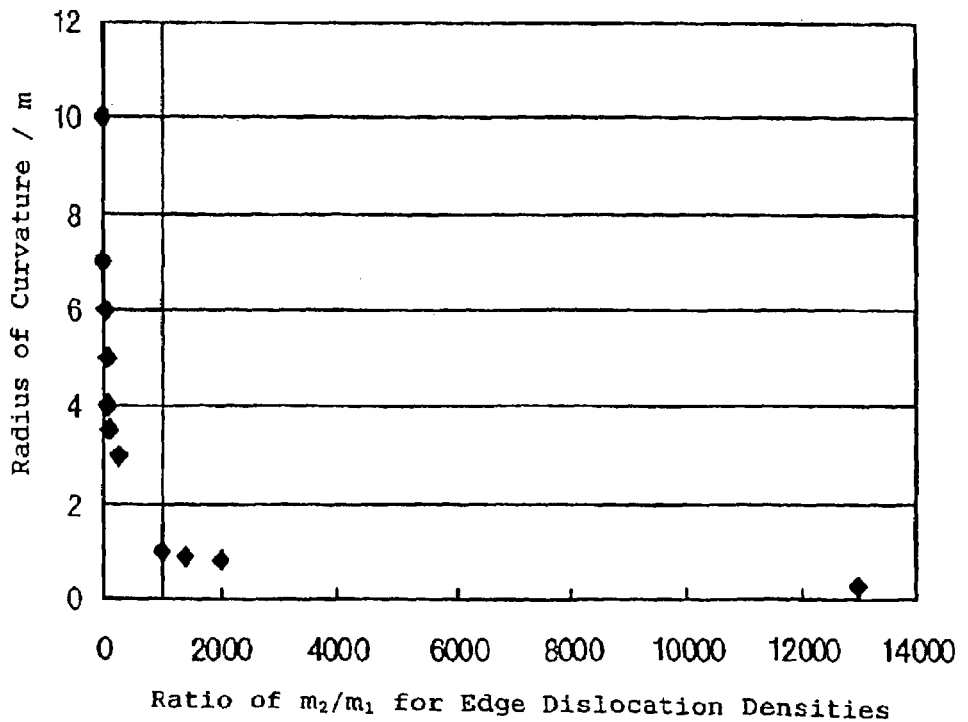
FIG. 9 is a plot showing the dependence of the radius of curvature of the substrate on the ratio of the edge dislocation densities observed on the obverse surface and the reverse surface in the self-supporting GaN substrate.

The results of the examples mentioned above are summarized in Table 1 and Table 2. In addition, the dependences of the radius of curvature of the substrate on the ratio of dislocation density of the obverse surface to that of the reverse surface in the self-supporting GaN substrate obtained are shown in FIG. 8 and FIG. 9. As seen in the results of FIG. 8 and FIG. 9, the radius of curvature sharply increases and, thus, the degree of the warp decreases, when the ratio of the total dislocation densities is less than 750 (a line in FIG. 8 indicating a ratio of the total dislocation densities of 750) and when the ratio of the edge dislocation densities is less than 1000 (a line in FIG. 9 indicating a ratio of the edge dislocation densities of 1000).

TABLE 1

| | Example 1 | | Example 2 | |
|---|---|---|---|---|
| | Without Treatment | With Treatment | Without Treatment | With Treatment |
| Density of Dislocation (cm$^{-2}$) | | | | |
| Rear face | $5 \times 10^9$ | $5 \times 10^7$ | $1.5 \times 10^9$ | $5 \times 10^8$ |
| Growth front face | $1 \times 10^6$ | $1 \times 10^6$ | $2 \times 10^6$ | $2 \times 10^6$ |
| Density of Edge Dislocation (cm$^{-2}$) | | | | |
| Rear face | $4.5 \times 10^9$ | $3 \times 10^7$ | $1 \times 10^9$ | $2.5 \times 10^8$ |
| Growth front face | $3.5 \times 10^5$ | $3.5 \times 10^5$ | $1 \times 10^6$ | $1 \times 10^6$ |
| Ratio of Total Dislocation Densities: n$_2$/n$_1$ | 5000 | 50 | 750 | 250 |
| Ratio of Edge Dislocation Densities: m$_2$/m$_1$ | 13000 | 86 | 1000 | 250 |
| Radius of Curvature (m) | 0.3 | 5 | 1 | 3 |

| | Example 3 | | Example 4 | |
|---|---|---|---|---|
| | Without Treatment | With Treatment | Without Treatment | With Treatment |
| Density of Dislocation (cm$^{-2}$) | | | | |
| Rear face | $3 \times 10^3$ | $3.5 \times 10^9$ | $9 \times 10^9$ | $4 \times 10^7$ |
| Growth front face | $3 \times 10^6$ | $3 \times 10^6$ | $1 \times 10^7$ | $8 \times 10^5$ |
| Density of Edge Dislocation (cm$^{-2}$) | | | | |
| Rear face | $2.4 \times 10^9$ | $1 \times 10^8$ | $7 \times 10^9$ | $1 \times 10^7$ |
| Growth front face | $1.2 \times 10^5$ | $1.2 \times 10^5$ | $5 \times 10^6$ | $3 \times 10^5$ |
| Ratio of Total Dislocation Densities: n$_2$/n$_1$ | 1000 | 120 | 900 | 50 |
| Ratio of Edge Dislocation Densities: m$_2$/m$_1$ | 2000 | 83 | 1400 | 33 |
| Radius of Curvature (m) | 0.8 | 4 | 0.9 | 6 |

TABLE 2

| | Example 5 | | Example 6 | |
|---|---|---|---|---|
| | Without Treatment | With Treatment | Without Treatment | With Treatment |
| Density of Dislocation (cm$^{-2}$) | | | | |
| Rear face | $9 \times 10^9$ | $4 \times 10^7$ | $9 \times 10^9$ | $2 \times 10^7$ |
| Growth front face | $1 \times 10^7$ | $5 \times 10^6$ | $1 \times 10^7$ | $4 \times 10^6$ |
| Density of Edge Dislocation (cm$^{-2}$) | | | | |
| Rear face | $7 \times 10^9$ | $1.5 \times 10^7$ | $7 \times 10^9$ | $9 \times 10^6$ |
| Growth front face | $5 \times 10^6$ | $2 \times 10^6$ | $5 \times 10^6$ | $1.5 \times 10^6$ |
| Ratio of Total Dislocation Densities: n$_2$/n$_1$ | 900 | 8 | 900 | 5 |
| Ratio of Edge Dislocation Densities: m$_2$/m$_1$ | 1400 | 7.5 | 1400 | 6 |
| Radius of Curvature (m) | 0.9 | 7 | 0.9 | 10 |

TABLE 2-continued

| | Example 7 | |
|---|---|---|
| | Without Treatment | With Treatment |
| Density of Dislocation (cm$^{-2}$) | | |
| Rear face | 9 × 10$^9$ | 6 × 10$^7$ |
| Growth front face | 1 × 10$^7$ | 9 × 10$^5$ |
| Density of Edge Dislocation (cm$^{-2}$) | | |
| Rear face | 7 × 10$^9$ | 4 × 10$^7$ |
| Growth front face | 5 × 10$^6$ | 3.5 × 10$^5$ |
| Ratio of Total Dislocation Densities: n$_2$/n$_1$ | 900 | 67 |
| Ratio of Edge Dislocation Densities: m$_2$/m$_1$ | 1400 | 114 |
| Radius of Curvature (m) | 0.9 | 3.5 |

While preferred embodiments have been described by referring the examples, it is to be understood by those skilled in the art that the foregoing description is intended to illustrate the present invention and that various changes and modifications in the combination of the process of the examples herein described may be made without departing from the spirit and scope of the invention, which variation and modification fall into the technical scope of this invention. For instance, in Example 5 or Example 6, after removing the sapphire substrate, an additional treatment to reduce dislocations may be carried out. For example, the step of removing a region to a thickness of 100 μm or more from the side from which the substrate of the different material has been separated may be performed. Alternatively, the step of conducting a heat treatment of the self-supporting GaN substrate at a temperature not lower than 1150° C. may be performed.

Further, while examples of a process for manufacturing a self-supporting GaN substrate are given in Examples, the present invention can be applied to a self-supporting AlGaN substrate.

SUMMARY OF DISCLOSURE

As set forth above, in the present invention, because the dislocation densities in the substrate, especially the edge dislocation densities therein are well controlled, a self-supporting group III nitride based semiconductor substrate having a lessened warp can be stably obtained.

The application of substrate of the present invention enables high-yield production of light emission devices and electron devices in accordance with design.

What we claim is:

1. A self-supporting substrate of group III nitride based semiconductor; wherein
the self-supporting substrate is formed by growing a layer of group III nitride based semiconductor on a substrate of a different material and thereafter removing the substrate of the different material; and wherein
the self-supporting substrate has a surface of a front side and a surface of a rear side;
a dislocation density for the surface of the front side and a dislocation density for the surface of the rear side are different from one another; and
on comparison between the dislocation density for the surface of the front side and the dislocation density for the surface of the rear side,
when a lower dislocation density selected from the dislocation density for the surface of the front side or the dislocation density for the surface of the rear side is designated n$_1$, and a higher dislocation density selected from the dislocation density for the surface of the front side or the dislocation density for the surface of the rear side is designated n$_2$, a ratio of n$_2$/n$_1$ is 250 or less.

2. A self-supporting substrate of group III nitride based semiconductor as claimed in claim 1, wherein n$_1$ is not higher than 1×10$^8$ cm$^{-2}$.

3. A self-supporting substrate of group III nitride based semiconductor; wherein
the self-supporting substrate is formed by growing a layer of group III nitride based semiconductor on a substrate of a different material and thereafter removing the substrate of the different material; and wherein
the self-supporting substrate has a surface of a front side and a surface of a rear side;
an edge dislocation density for the surface of the front side and an edge dislocation density for the surface of the rear side are different from one another; and
on comparison between an edge dislocation density for the surface of the front side an edge dislocation density for the surface of the rear side, when a lower edge dislocation density selected from the edge dislocation density for the surface of the front side or the edge dislocation density for the surface of the rear side is designated m$_1$ and a higher edge dislocation density selected from the edge dislocation density for the surface of the front side or the edge dislocation density for the surface of the rear side is designated m$_2$, a ratio of m$_2$/m$_1$ is 250 or less.

4. A self-supporting substrate of group III nitride based semiconductor as claimed in claim 3, wherein a thickness thereof is not less than 30 μm but not greater than 1 mm.

5. A self-supporting substrate of group III nitride based semiconductor as claimed in claim 3, wherein it comprises a layer made of GaN or AlGaN.

6. A self-supporting substrate of group III nitride based semiconductor as claimed in claim 3, wherein m$_1$ is not higher than 5×10$^8$ cm$^{-7}$.

7. A self-supporting substrate of group III nitride based semiconductor as claimed in claim 1, wherein a thickness thereof is not less than 30 μm but not greater than 1 mm.

8. A self-supporting substrate of group III nitride based semiconductor as claimed in claim 1, wherein it comprises a layer made of GaN or AlGaN.

9. A self-supporting substrate of group III nitride based semiconductor claimed in claim 1,
wherein a ratio of n$_2$/n$_1$ is in the range of $5 \leq n_2/n_1 \leq 250$.

10. A self-supporting substrate of group III nitride based semiconductor claimed in claim 3,
wherein a ratio of m$_2$/m$_1$ is in the range of $6 \leq m_2/m_1 \leq 250$.

11. A self-supporting substrate of group III nitride based semiconductor; wherein
the self-supporting substrate is made from a layer of group III nitride based semiconductor grown by epitaxial growth;

the self-supporting substrate has a surface of a front side and a surface of a rear side;

a dislocation density for the surface of the front side and a dislocation density for the surface of the rear side are different from each other; and on comparison between the dislocation density for the surface of the front side and the dislocation density for the surface of the rear side, when a lower dislocation density selected from the dislocation density for the surface of the front side or the dislocation density for the surface of the rear side is designated $n_1$ and a higher dislocation density selected from the dislocation density for the surface of the front side or the dislocation density for the surface of the rear side is designated $n_2$, a ratio of $n_2/n_1$ is 250 or less.

12. A self-supporting substrate of group III nitride based semiconductor claimed in claim 11, wherein $n_1$ is not higher than $1 \times 10^8$ cm$^{-2}$.

13. A self-supporting substrate of group III nitride based semiconductor claimed in claim 11, wherein a ratio of $n_2/n_1$ is in the range of $5 \leq n_2/n_1 \leq 250$.

14. A self-supporting substrate of group III nitride based semiconductor; wherein the self-supporting substrate is made from a layer of group III nitride based semiconductor grown by epitaxial growth;

the self-supporting substrate has a surface of a front side and a surface of a rear side;

an edge dislocation density for the surface of the front side and an edge dislocation density for the surface of the rear side are different from each other; and on comparison between an edge dislocation density for the surface of the front side and an edge dislocation density for the surface of the rear side, when a lower edge dislocation density selected from the edge dislocation density for the surface of the front side or the edge dislocation density for the surface of the rear side is designated $m_1$ and a higher edge dislocation density selected from the edge dislocation density for the surface of the front side or the edge dislocation density for the surface of the rear side is designated $m_2$, a ratio of $m_2/m_1$ is 250 or less.

15. A self-supporting substrate of group III nitride based semiconductor claimed in claim 14, wherein $m_1$ is not higher than $5 \times 10^8$ cm$^{-7}$.

16. A self-supporting substrate of group III nitride based semiconductor claimed in claim 14, wherein a ratio of $m_2/m_1$ is in the range of $6 \leq m_2/m_1 \leq 250$.

* * * * *